(12) United States Patent
Ye et al.

(10) Patent No.: US 6,908,815 B2
(45) Date of Patent: Jun. 21, 2005

(54) DUAL WORK FUNCTION SEMICONDUCTOR STRUCTURE WITH BORDERLESS CONTACT AND METHOD OF FABRICATING THE SAME

(75) Inventors: Qiuyi Ye, Hopewell Junction, NY (US); William R. Tonti, Essex Junction, VT (US); Yujun Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/624,781

(22) Filed: Jul. 22, 2003

(65) Prior Publication Data

US 2004/0108555 A1 Jun. 10, 2004

Related U.S. Application Data

(63) Continuation of application No. 09/772,630, filed on Jan. 30, 2001, now Pat. No. 6,642,584.

(51) Int. Cl.$^7$ .................. H01L 21/336; H01L 21/8242
(52) U.S. Cl. .................. 438/258; 438/269; 438/253
(58) Field of Search .................. 438/258, 250, 438/253, 255, 269, 592

(56) References Cited

U.S. PATENT DOCUMENTS

| | | | | |
|---|---|---|---|---|
| 4,246,044 A | * | 1/1981 | Yanase | 438/289 |
| 5,258,645 A | * | 11/1993 | Sato | 257/637 |
| 5,444,653 A | | 8/1995 | Nagasawa et al. | 365/149 |
| 5,466,636 A | | 11/1995 | Cronin et al. | 437/187 |
| 5,538,922 A | | 7/1996 | Cooper et al. | 437/195 |
| 5,569,948 A | | 10/1996 | Kim | 257/382 |
| 5,591,301 A | | 1/1997 | Grewal | 156/643.1 |
| 5,610,101 A | | 3/1997 | Koyama | 437/195 |
| 5,654,236 A | | 8/1997 | Kasai | 438/639 |
| 5,723,381 A | | 3/1998 | Grewal et al. | 438/633 |
| 5,731,242 A | | 3/1998 | Parat et al. | 438/586 |
| 5,759,867 A | | 6/1998 | Armacost et al. | 437/195 |
| 5,808,365 A | | 9/1998 | Mori | 257/775 |
| 5,874,756 A | | 2/1999 | Ema et al. | 257/296 |
| 5,882,968 A | * | 3/1999 | Jun | 438/254 |
| 5,913,114 A | * | 6/1999 | Lee et al. | 438/202 |
| 5,929,524 A | | 7/1999 | Drynan et al. | 257/758 |
| 5,932,906 A | | 8/1999 | Shimizu | 257/306 |
| 5,939,746 A | | 8/1999 | Koyama et al. | 257/306 |
| 5,960,318 A | | 9/1999 | Peschke et al. | 438/637 |
| 5,973,348 A | | 10/1999 | Ishibashi | 257/306 |
| 5,977,583 A | | 11/1999 | Hosotani et al. | 257/311 |
| 5,990,507 A | | 11/1999 | Mochizuki et al. | 257/295 |
| 6,022,776 A | * | 2/2000 | Lien et al. | 438/253 |
| 6,046,103 A | | 4/2000 | Thei et al. | 438/624 |
| 6,165,901 A | * | 12/2000 | Hsu | 438/652 |
| 6,211,021 B1 | | 4/2001 | Wang et al. | 438/296 |
| 6,228,777 B1 | | 5/2001 | Arafa et al. | 438/740 |
| 6,235,593 B1 | * | 5/2001 | Huang | 438/279 |
| 6,265,271 B1 | | 7/2001 | Thei et al. | 438/296 |
| 6,271,087 B1 | * | 8/2001 | Kinoshita et al. | 438/258 |
| 6,326,270 B1 | * | 12/2001 | Lee et al. | 438/279 |
| 6,406,987 B1 | | 6/2002 | Huang | 438/595 |
| 6,633,069 B2 | * | 10/2003 | Nii et al. | 438/202 |
| 6,686,668 B2 | * | 2/2004 | Nesbit et al. | 438/253 |

* cited by examiner

*Primary Examiner*—Michael S. Lebentritt
*Assistant Examiner*—Walter L. Lindsay, Jr.
(74) *Attorney, Agent, or Firm*—William D. Sabo, Esq.; Kevin P. Radigan, Esq.; Heslin Rothenberg Farley & Mesiti, P.C.

(57) ABSTRACT

A dual work function semiconductor structure with borderless contact and method of fabricating the same are presented. The structure may include a field effect transistor (FET) having a substantially cap-free gate and a conductive contact to a diffusion adjacent to the cap-free gate, wherein the conductive contact is borderless to the gate. Because the structure is a dual work function structure, the conductive contact is allowed to extend over the cap-free gate without being electrically connected thereto.

7 Claims, 8 Drawing Sheets

DUAL WORK FUNCTION SEMICONDUCTOR STRUCTURE WITH BORDERLESS CONTACT AND METHOD OF FABRICATING THE SAME

CROSS-REFERENCE TO RELATED APPLICATION

This patent application is a continuation of U.S. patent application Ser. No. 09/772,630, filed on Jan. 30, 2001 now U.S. Pat. Ser. No. 6,642,584, which is hereby incorporated herein by reference in its entirety.

TECHNICAL FIELD

The present invention relates in general to semiconductor structures and methods of fabrication thereof, and more particularly, to the integration of embedded memory, such as an embedded DRAM, in a logic process lacking borderless contacts. In accordance with this invention, a semiconductor structure and method of fabrication are presented wherein a type of borderless contact is improvised in an array cell in order that contacts can land over gate electrodes without effecting a dual work function logic process, thereby allowing for improved array density.

BACKGROUND OF THE INVENTION

The integration of logic arrays and memory arrays, such as dynamic random access memory (DRAM), within a single semiconductor structure continues to increase every year. This integration of logic and DRAMs to achieve dense high performance embedded dynamic random access memory (EDRAM) technology presents two basic tradeoffs: either a dense memory cell array with slower logic can be achieved, or an inefficient, larger memory cell array with faster logic is possible.

In the dense memory array with slower logic design, referred in the industry as merged DRAM logic (MDL), a high speed dual work function (DWF) logic support design is traded for a conventional DRAM (CDRAM) based single work function (SWF) design. A SWF design comprises relatively "slower" logic with a capped gate electrode leading to a very dense memory array design employing a borderless pitch array, i.e., an array that is borderless between the gate (word-line) and bit-line contact. The MDL design typically has a logic core performance that is 20–30% slower than the alternative large cell memory array and fast logic approach.

In the large cell memory array and fast logic approach, referred to in the industry as merged logic DRAM (MLD), a densely packed memory array cell is traded for the high speed dual work function (DWF) logic. A borderless array bit-line contact is given up, and the array cell efficiency is decreased by at least 30% compared with the above-described dense array and slower logic implementation (i.e., MDL design).

In view of the above tradeoffs, there exists a need in the art for a structure which integrates dual work function logic technology with a borderless contact to achieve MLD performance and MDL array efficiency, and which results in a cost effective, high performance embedded DRAM structure and process.

SUMMARY OF THE INVENTION

Briefly summarized, the present invention comprises in one aspect a semiconductor structure including a field effect transistor (FET) with a substantially cap-free gate and a conductive contact to a diffusion adjacent to the gate, wherein the conductive contact is borderless to the gate. The substantially cap-free gate is an MLD technology characteristic, while the borderless contact is a characteristic of the MDL design. In the array, this contact is typically used to connect to the memory bit-line. Note, that the contact may also be used in the logic core.

In a further aspect, a semiconductor structure is provided which includes a first material and a second material. The first material has a first contact hole with a horizontal surface of the first material being adjacent to the first contact hole. The second material extends over the first material and the second material comprises a second contact hole, with the second contact hole extending over the first contact hole to expose a portion of the horizontal surface. A conductor is disposed within the first contact hole, and a spacer lines the second contact hole and extends over the conductor. The spacer has a dimension sufficient so that no horizontal surface of the first material is exposed through the second contact hole.

In a further aspect, a method of processing a semiconductor is provided which includes: providing a substrate; forming a film on the substrate, the film having a top surface; forming a hole through the film; providing an insulating layer having an opening aligned to the hole and larger than the hole so a portion of the top surface of the film is exposed; providing a material in the hole; and providing a spacer along sidewalls of the opening to shrink the opening and cover exposed portions of the top surface of the film, wherein the spacer may extend partially over the material within the hole.

Advantageously, this invention presents a semiconductor structure and method of fabrication wherein a borderless contact is provided within a dual work function logic process. Essentially, this invention employs the best elements of single work function logic and dual work function logic, and develops an MLD technology with exemplary features of MLD (i.e., DWF), and MDL (i.e., borderless contact). In accordance with the present invention, there is no need for a process fabricator to employ two tool sets for an integrated DRAM and logic design (as previously needed). The process embodiments presented leave the option open for silicide or non-silicide designs. The silicide process is easily integrated into the core logic process. In accordance with the present invention, each transistor gate is electrically isolated from the adjacent diffusion contact.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 11C is a cross-sectional elevational view of the structure of

FIG. 11B after formation of a side wall spacer above the bit-line polysilicon.

BEST MODE FOR CARRYING OUT THE INVENTION

Figure 1:
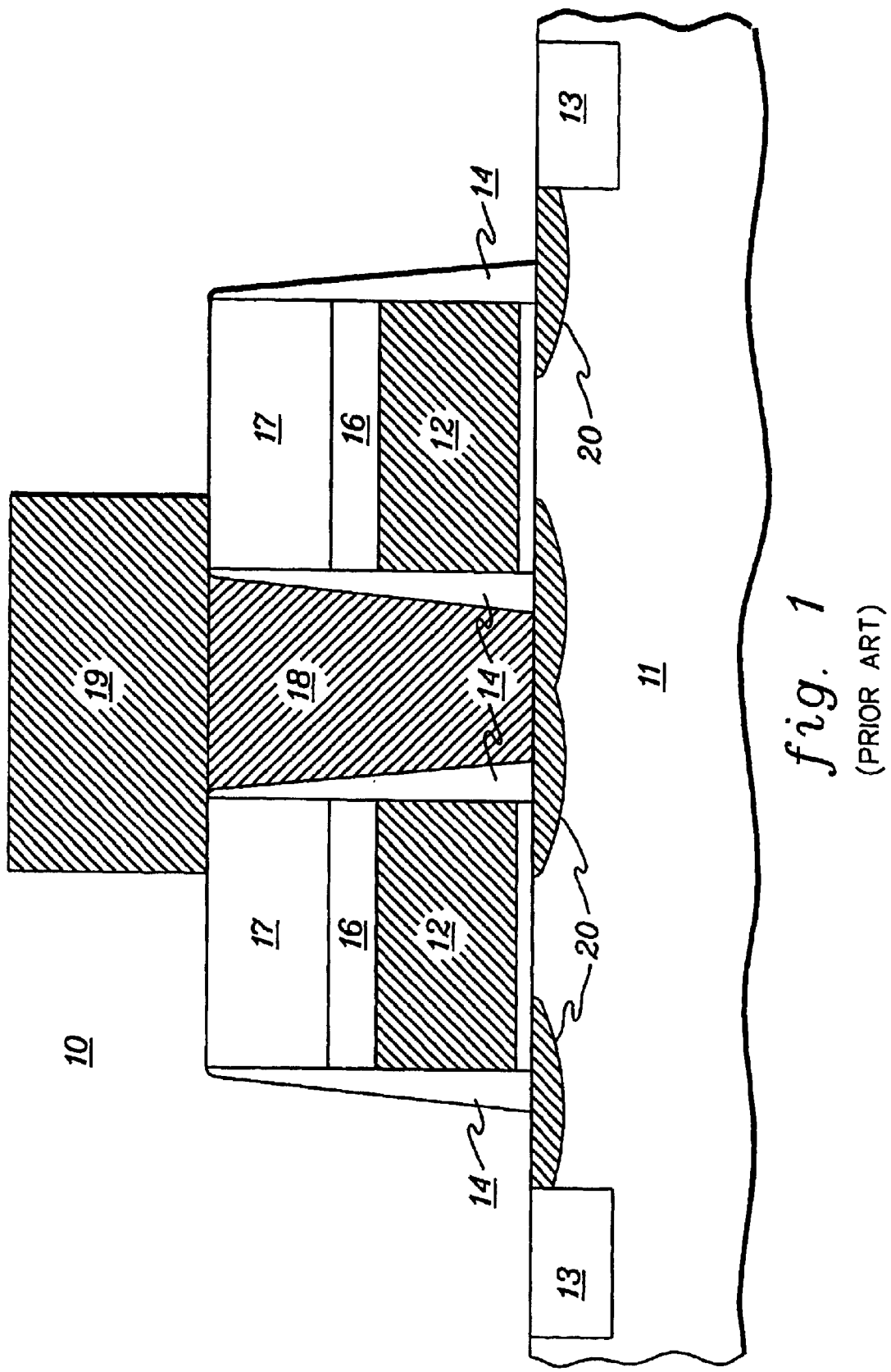
FIG. 1 is a partial cross-sectional view of a conventional semiconductor structure employing a borderless bit-line contact and an insulative cap over the gate.

The following definitions are relevant to the present invention.

Dual Work Function (DWF)

Characteristics of a dual work function design include a P+ polysilicon gated PFET or N+ polysilicon gated NFET, wherein the design results in surface channel conducting PFET and NFET devices. A benefit of the design is that PFET gate control is equivalent to NFET gate control for short channel properties. Both devices can turn off with low sub-threshold leakage, and the PFET gate length is the same as the NFET gate length leading to high performance logic. The conventional disadvantage is that diffusion contacts are not allowed to land over the gate electrode, thus an additional minimum image+overlay tolerance is used for each device diffusion interconnect. For a DRAM cell, this increases the cell size in the bit-line dimension by at least 1 F (i.e., one minimal feature). This process is also thought to be "expensive". The additional space for diffusion contacts reduces the array efficiency, and the space between the diffusion contact and the source drain gate boundary typically has to be "filled" with a low resistance path (to keep the speed, i.e., the "R" of the spaced out diffusion consistent). This typically involves adding a silicide process to lower the source drain resistance (which also goes over the gate electrode). In typical practice, the N+ (nfet) and P+ (pfet) gate electrodes are simultaneously implanted with the respective device n+ and p+ diffusion electrodes. These devices do not have a cap over the gate electrode, thus shallow source drain implants enter the gate electrode, which is typically deposited intrinsic (i.e., not pre-doped).

Single Work Function (SWF)

The single work function characteristic comprises N+ polysilicon gated PFETs, and N+ polysilicon gated NFETs. This design results in surface channel conducting NFET and buried channel conducting PFET devices, i.e., the PFET device VT with an N+ gate is approximately −1.0 volts, which is too low for CMOS operation. The channel is compensated with a p- implant (wherein the normal channel is n-type, creating a buried p to n layer. A gated conducting channel is then removed from the silicon/silicon dioxide surface, and the coupling to the gate is significantly decreased over the DWF scenario outlined above. The benefit of this design is that the SWF gate electrode can be pre-implanted prior to gate etching, and an insulating cap (standard DRAM practice employing a borderless gate to diffusion contact) can be formed. Additionally, materials such as $WSi_2$ or W/WN (tungsten/tungsten nitride) can be added to the gate stack prior to the cap layer being formed to substantially reduce the gate sheet resistance. Since the diffusion contacts are adjacent to the gate electrode, a silicide is not required, the gate stack can then be etched with the cap in place. This leads to a minimum cost DRAM process employing a borderless contact array feature. (Note: an N+ gate conductor can withstand all high subsequent thermal processings, since n+ doping will not leave the gate electrode and penetrate into the substrate. A P+ gate conductor cannot withstand the high subsequent thermal process, i.e., p+ doping will penetrate into the substrate, damaging the pfet device. This is why in DWF processing, the electrodes are simultaneously implanted at the very last possible process step to avoid the high thermal processes if they were pre-implanted. This problem is commonly referred to as "boron penetration" in a PFET. One benefit of the SWF design is that the SWF results in a capped gate which allows for a diffusion contact to land on top of the electrode without shorting to it. In a DRAM process, the bit-line can therefore be fabricated without adding a feature to space it from the gate electrode. The disadvantage of a SWF design is that the buried channel pfet devices typically have to be physically drawn larger (i.e., gate length) as compared to the nfet devices due to the poorer gate control (i.e., the off current is significantly higher in SWF pfets as compared with DWF pfets). The off current is defined as the leakage from drain to source when the gate is at 0.0 volts for an nfet device.

Further information regarding DWF designs and SWF designs is provided by B. El-Kareh, W. W. Abadeer, W. R. Tonti, "Design of Sub-Micron PMOSFETs for DRAM Array Applications", IEDM Technical Design (1991), the entirety of which is hereby incorporated herein by reference.

Borderless Contact

In a borderless contact design, the conductive contact to an adjacent diffusion electrode can land over the gate electrode without shorting to it. The diffusion contact can therefore be formed adjacent to and on the gate as long as the diffusion opening can be cleared by an etch. Typically, this implies one minimum image is required.

Bordered Contact

In a bordered contact design, the conductive contact to an adjacent diffusion electrode cannot land over the gate electrode without shorting to it. The conductive contact cannot be formed adjacent to or on the gate. Typically, this implies two minimum images+and an overlay tolerance is required to land the contact "off" the gate.

MLD

MLD refers to a merged logic DRAM design. In this design, a logic DWF core is employed, along with a sparse DRAM cell using a bordered bit-line contact.

MDL

The MDL design is a merged DRAM logic design wherein a dense DRAM array is employed with borderless contacts. The logic lithography (which is typically a generation ahead of the DRAM lithography) is used, along with a logic NFET device, and the logic back end of line (typically, greater than a 3 level metal standard DRAM process) is employed, along with the slower DRAM buried channel PFET (SWF) technology.

The goal of the present invention is to integrate the best elements of a DWF and SWF design, and develop an MLD technology using these best features of MLD (DWF) and MDL (borderless contact). The invention is described below in greater detail with reference to the accompanying drawing figures.

Figure 2:
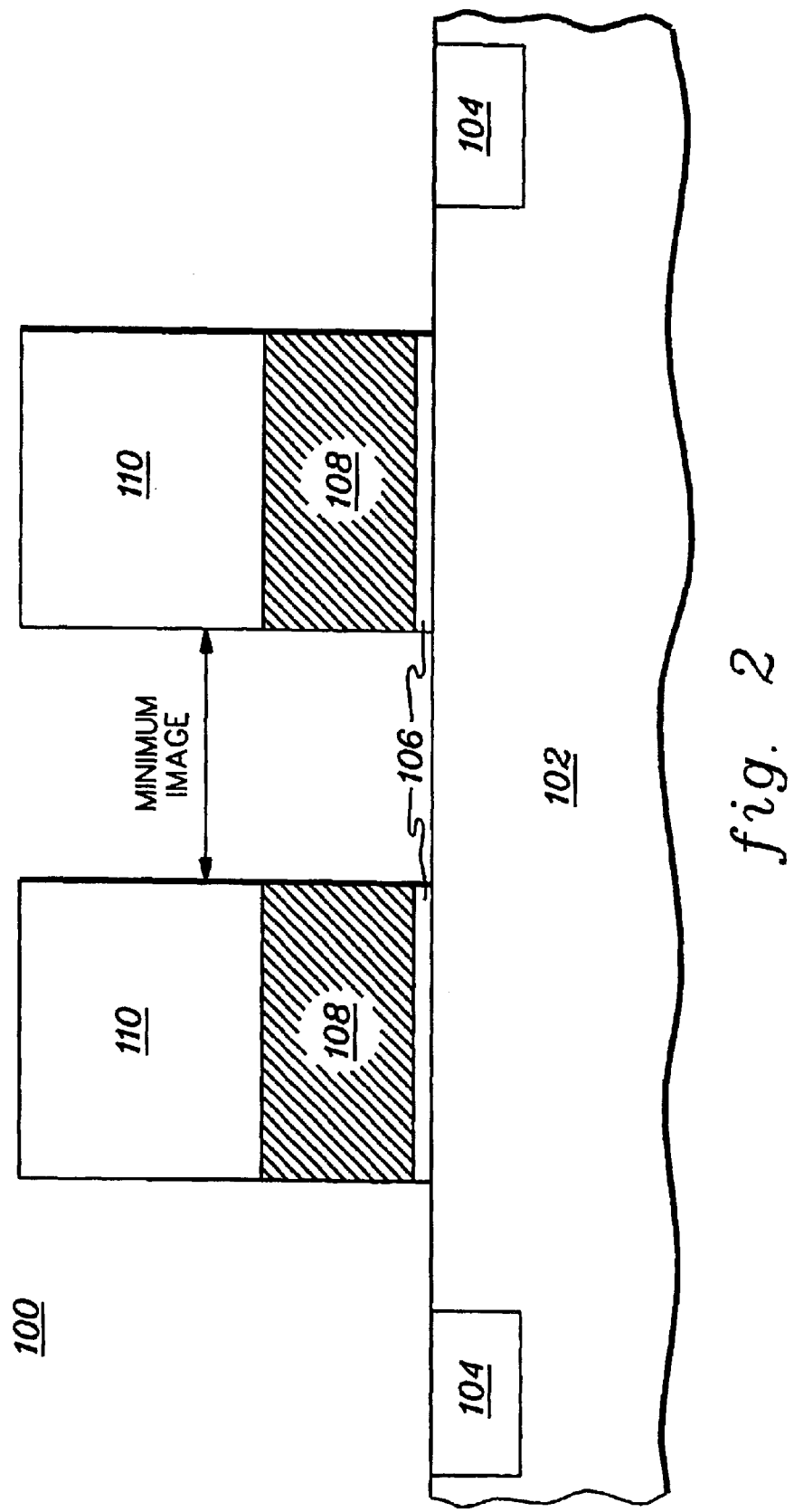
FIG. 2 is a partial cross-sectional view of an intermediate structure attained during a semiconductor processing approach in accordance with the principles of the present invention.

FIG. 1 depicts one embodiment of a conventional dense dynamic random access memory (DRAM) for integration in a logic process. In this embodiment, semiconductor structure 10 includes a substrate 11 having isolation regions 13 formed therein, with two gate stacks formed above the substrate within the isolation regions. Each stack includes, for example, a pre-doped polysilicon gate 12 with oxide spacers 14 surrounding the sidewalls thereof. A silicide material 16 can be pre-deposited to lower gate resistance and a silicon nitride cap 17 is disposed over each silicided gate to preserve borderless contacts. The stacks are spaced a minimum image apart with a bit-line polysilicon contact 18 disposed therebetween. A final bit-line contact 19 falls over each stack and electrically connects to bit-line contact 18. The silicon nitride caps 17 ensure electrical isolation of the final bit-line contact from the gate structures. Source/drain diffusions 20 are also shown within substrate 11. If the memory cell comprises a trench capacitor, the trench process (not shown) has already been completed. If the memory cell is a stacked cell (not shown), then the process sequence will integrate with fabrication of the above-summarized structure. In either scenario, the storage device is independent of the concepts described herein below. Concepts to note from FIG. 1 are that the process action carried out includes patterning the polysilicon gates. The array bit-line space is a minimum image between gate stacks, and also, the sidewall gate spacers are preferably defined at this time. The structure of FIG. 1, however, has certain limitations. For example, the image control is approximately two times worse than that of an intrinsic polysilicon gate (as depicted in FIG. 2 in accordance with the present invention). Further, a dual work-function implementation is near impossible. A higher cost for embedded DRAM results due to the non-integratable DRAM/logic features (for example, gate stack and borderless contact). There is an increased logic performance cost and pre-spacer use limits source/drain optimization.

FIG. 2 depicts an intermediate structure in a semiconductor processing approach in accordance with the present invention. This structure, generally denoted 100, again includes a substrate 102, such as a silicon substrate having isolation regions 104 between which gate stacks are to be defined. Although not shown, device NFET/PFET/array well implants are assumed to have taken place. A gate oxide 106 has been formed and patterned above which blanket uncapped intrinsic polysilicon 108 has been formed and patterned employing a photo resist mask 110. If the memory cell comprises a trench capacitor, then the trench process has been completed. If the memory cell is stacked, then the process sequence will integrate with the back end of line (BEOL) processings. In either scenario, the storage device is independent of the concepts presented. The process action carried out in FIG. 2 is to pattern the polysilicon gates. Note that the array bit-line space between gate stacks is again a minimum image. As used herein, the "first contact hole" refers to the region in FIG. 2 defined by the top of the polysilicon film (108) to the substrate (102), and resulting from the gate patterning step.

Figure 3:
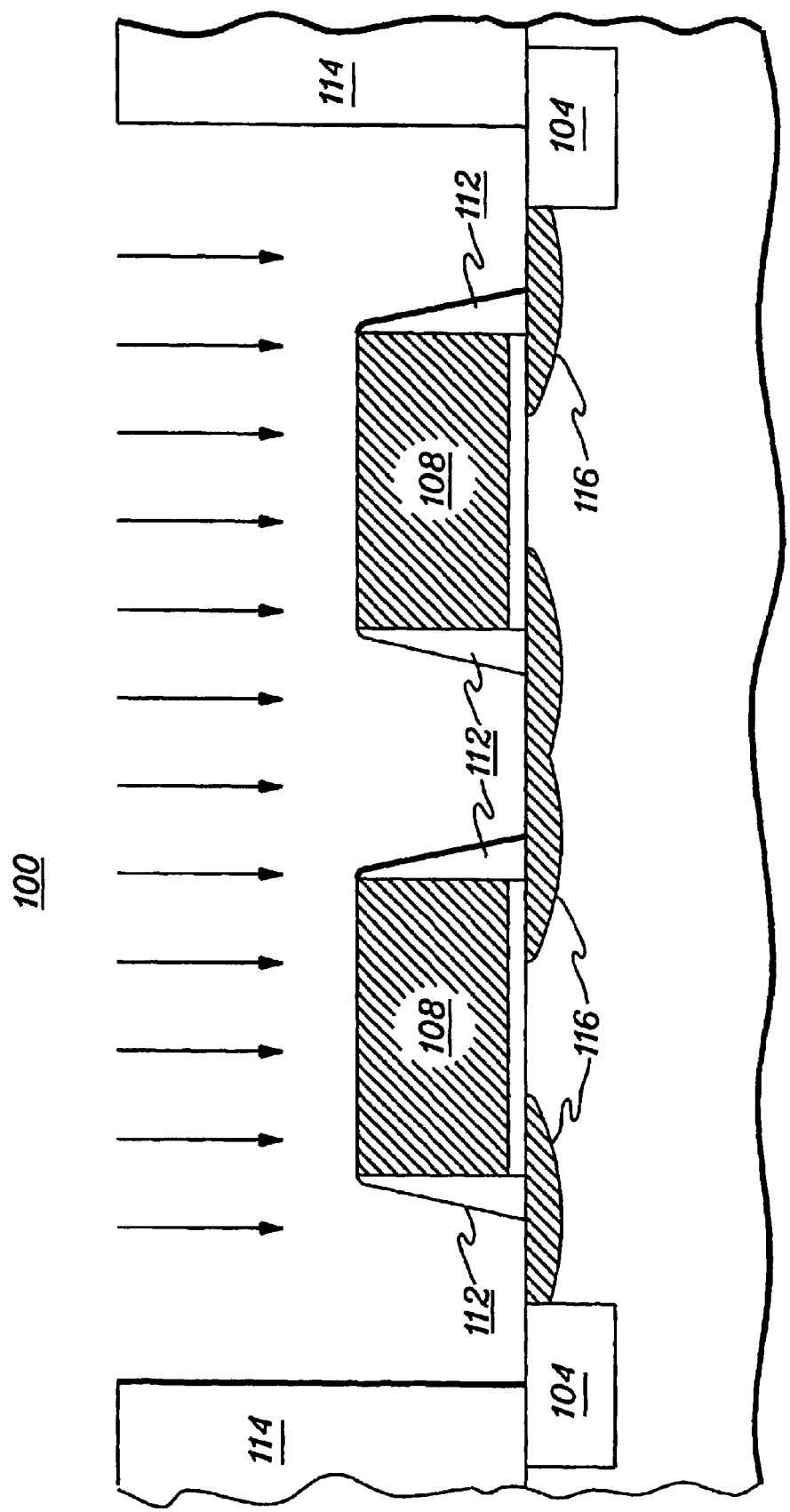
FIG. 3 is a cross-sectional elevational view of FIG. 2 after removal of the photo resist mask, formation of sidewall spacers and implanting of source, drain and gate electrodes.

In FIG. 3, the photo resist mask 110 of the structure 100 of FIG. 2 has been removed, sidewall spacers, for example, oxide spacers, 112 have been formed and photo resist masks 114 have been deposited and patterned to define PFET/NFET regions wherein the gate electrodes 108, and source/drain electrodes 116 are shown undergoing ion implanting. Several advantages flow from this process. First, if a high voltage/low leakage junction is desired, then a mask may be added blocking degenerate doping of the array gate/junction complex. In addition, using a mask, an alternate array spacer process may be defined, thereby developing a different array junction if required. For example, a pre-spacer may be used to block a source/drain (s/d) logic extension implant.

Figure 4:
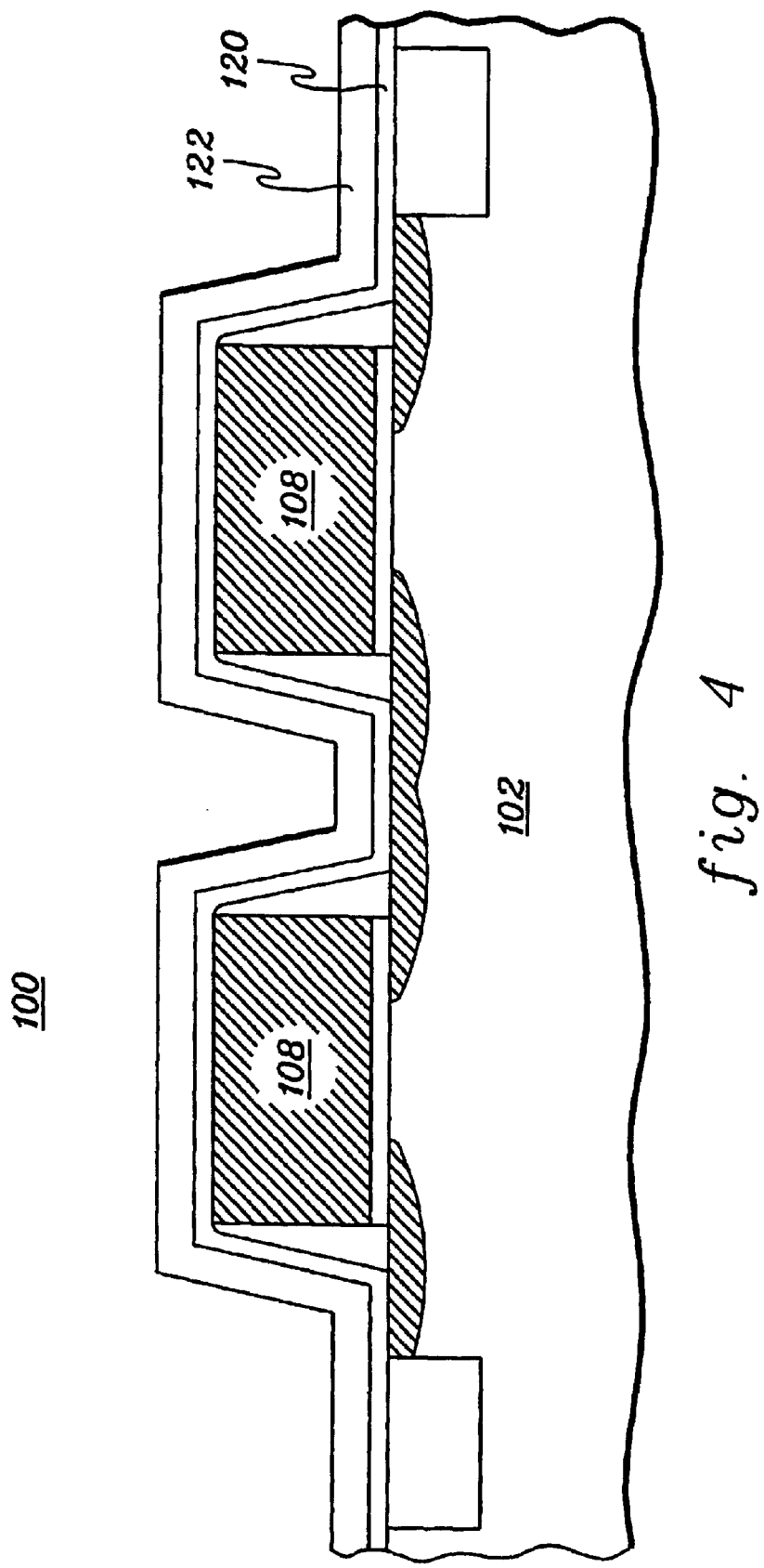
FIG. 4 is a cross-sectional elevational view of FIG. 3 after formation of a protective conformal oxide layer and conformal nitride layer.

FIG. 4 depicts the structure 100 of FIG. 3 after removal of photo resist mask 114, completion of implanting, and formation of a gate cap borderless wrapper comprising a conformal oxide layer 120 and a conformal nitride layer 122 deposited thereon. In one example, conformal oxide layer 120 may be 20–50 Å thick, and conformal nitride layer 122 may be 300–500 Å thick.

FIGS. 5–11D are an enlargement of structure 100 of FIG. 4, focusing on one transistor for clarity.

Figure 5:
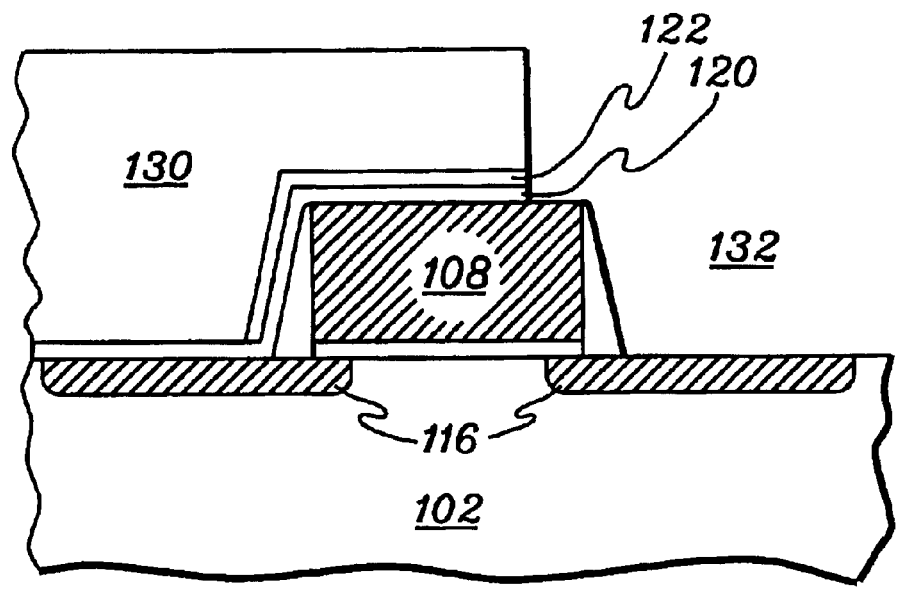
FIG. 5 is an enlarged, partial cross-sectional view of one transistor structure depicted in FIG. 4 after formation of a photo resist mask atop the nitride and oxide layers and patterning thereof to expose a portion of the gate.

FIG. 5 depicts one field effect transistor of structure 100, wherein a hard mask 130 (e.g., TEOS oxide) has been deposited and patterned to define an opening 132 exposing source/drain implant 116 above which the bit-line contact is to be formed. The photo resist mask 130 is assumed to land somewhere over the gate 108 and etching of the mask and oxide/nitride layers proceeds until a portion of the polysilicon gate 108 is exposed. As used herein, the "second contact hole" includes the region in FIG. 5 defined above the top of polysilicon film (108) to the top of the dielectric layer (122) and above. As shown in FIG. 5, the second contact hole extends over the first contact hole and exposes a portion of the top, horizontal surface of the gate structure.

Figure 6:
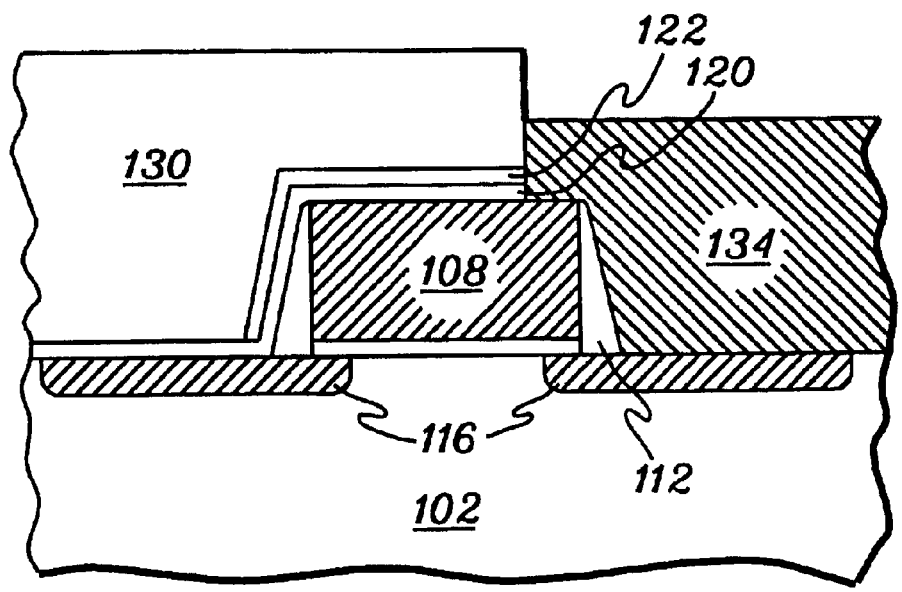
FIG. 6 is a partial cross-sectional view of the structure of FIG. 5 after formation of a bit-line polysilicon contact adjacent to and extending over the gate.
Figure 7:
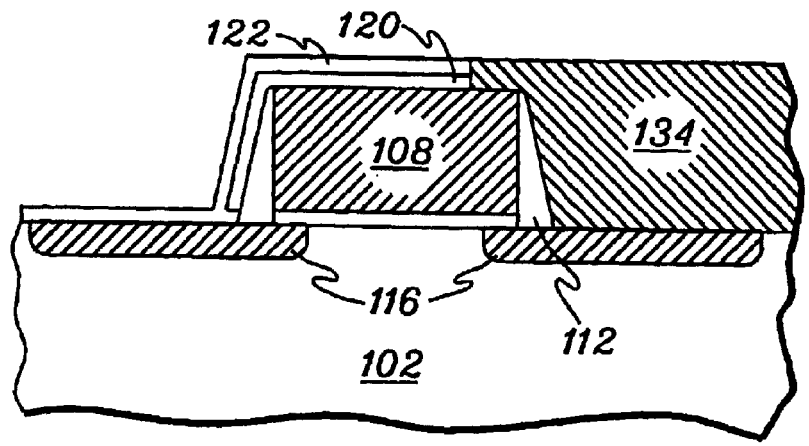
FIG. 7 is a cross-sectional elevational view of the structure of FIG. 6 after polishing to remove a portion of the bit-line polysilicon down to the nitride and oxide layers.

In FIG. 6, a bit-line polysilicon contact 134 has been formed within opening 132. The bit-line contact 134 may be n or p doped as required. Note that this intermediate structure has an electrical and physical connection between gate 108 and bit-line contact 134, which must be removed. In FIG. 7, a conventional chemical mechanical polish (CMP) process has been employed to etch the bit-line poly contact down to the upper surface of the oxide/nitride wrapper 120/122, which acts as a hard polish stop.

Figure 8:
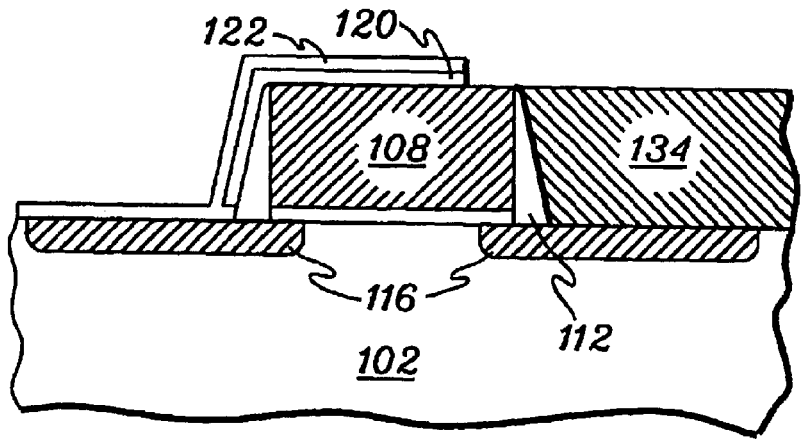
FIG. 8 is a cross-sectional elevational view of FIG. 7 after the bit-line polysilicon has been recessed to a minimum depth using a timed etch.

Next, in FIG. 8, the oxide nitride wrapper film 120, 122 is used as a mask for a time etch to etch the bit-line contact 134 and polysilicon gate 108 down to a minimum recess depth wherein the gate and bit-line contact are no longer in electrical contact. This is a time etch process and etching can proceed such that the polysilicon is removed to some level below the original surface of the polysilicon gate 108.

Figure 9:
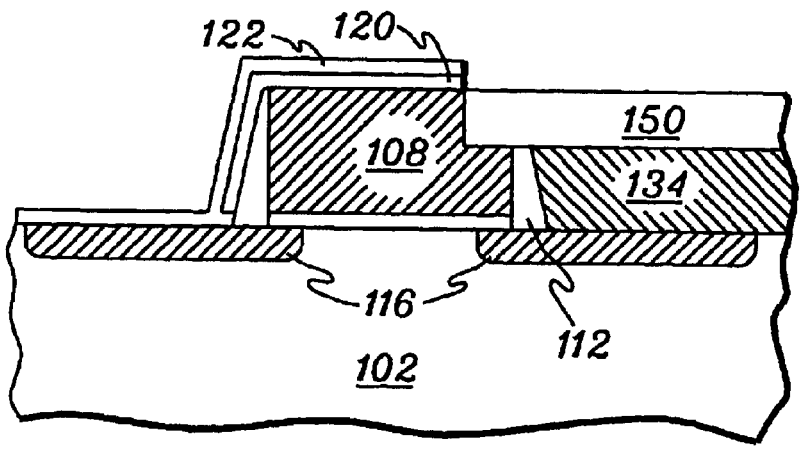
FIG. 9 is a cross-sectional elevational view of FIG. 8 after further etching of the bit-line polysilicon and gate and formation of an oxide thereon.

In FIG. 9, an oxide layer 150 has been formed over the bit-line contact 134 and exposed gate 108. Oxide layer 150 can be formed by further etching the polysilicon structures depicted in FIG. 8 and then depositing an oxide, or simply by oxidizing the exposed polysilicon. Note, if oxidation is used, then the etches described in FIG. 8 are optional. Those skilled in the art will note that the resultant structure has produced a bit-line contact 134 that is borderless to the gate electrode and that the two are electrically and physically isolated by sidewall spacer 112 and oxide 150. Thus, in accordance with the processings of FIGS. 2–9, a borderless semiconductor structure is attained without requiring another minimum pitch to define the bit-line contact. Note that if the bit-line contact 134 is comprised of a tungsten stud, then the contact is separated from the gate simply by etching polysilicon selective to W to a level such as shown in FIG. 9.

Figure 10A:
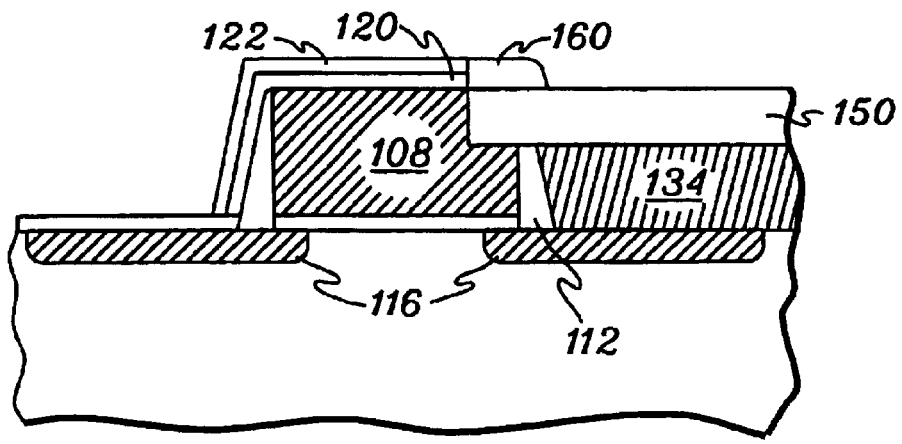
FIG. 10A is a cross-sectional elevational view of FIG. 9 after formation of a sidewall spacer covering the gate and extending to the bit-line polysilicon contact.
Figure 10B:
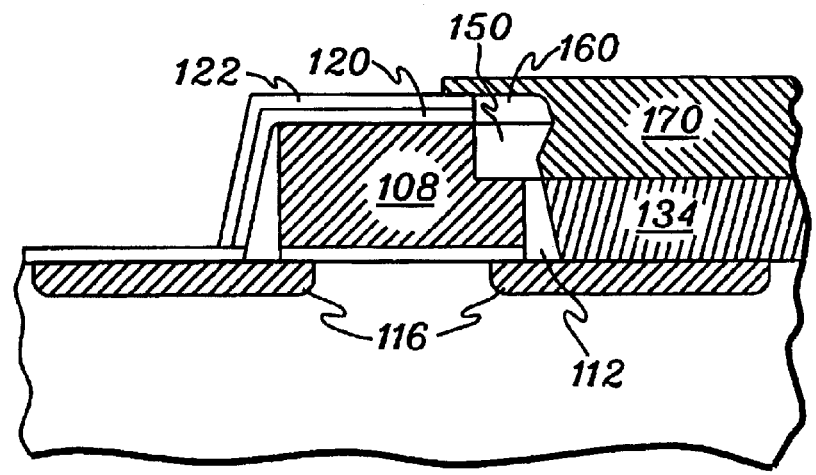
FIG. 10B is a cross-sectional elevational view of FIG. 10A after removal of the oxide over the bit-line polysilicon and formation of a final bit-line contact thereto, wherein the side wall spacer protects the gate from being exposed.

FIGS. 10A & 10B depict one embodiment for preparing a borderless contact for the final bit-line formation, while FIGS. 11A–11D depict a process for siliciding the gate and then preparing the bit-line contact for the bit-line formation.

Referring first to FIGS. 10A & 10B, the structure of FIG. 9 is shown in FIG. 10A with a sidewall spacer 160, for example, a silicon nitride spacer, having been defined above oxide 150 to completely cover the exposed region of gate 108 and extend slightly over bit-line contact 134. Spacer 160 is sized to completely cover and protect oxide 150 over gate 108. Spacer 160 can be formed by defining a mask, opening a region within which the spacer is to reside, depositing silicon nitride within that region, and again etching to remove the mask leaving the nitride spacer. Again, spacer 160 should at least slightly overlap the bit-line contact 134, but it's minimum rule would be defined so that the outer edge of spacer 112 is covered.

In FIG. 10B, oxide 150 is etched over bit-line contact 134 to expose the contact and final bit-line wiring 170 has been formed in electrical contact therewith. Note that silicon nitride spacer 160 protects oxide 150 in the region over gate 108 and ensures a borderless structure between the bit-line contact and gate 108.

In an optional approach, one would like to further reduce the diffusion and gate electrode resistance. Returning to the structure of FIG. 9, and assuming silicided contacts are to be formed, the nitride/oxide wrapper is first stripped from the structure and a silicide is deposited and reacted in conjunction with supports. Supports are all transistors that are not the memory transistor. Silicide 180 over gate 108 comprises a word-line silicide, which lowers gate resistivity, for example, from approximately 100 ohms per square to approximately 2–5 ohms per square. For example, cobalt or titanium silicide may be employed. Also shown is a node silicide 182 which can be formed depending upon the memory cell structure. If a trench cell structure is employed, then node 116 is typically sealed and silicide 182 does not form, however, if a raised capacitance cell is used, then silicide 182 is optional. Also note that this silicide is deposited in conjunction with the supports, where it is used on the diffusion and polysilicon gate levels.

Figure 11A:
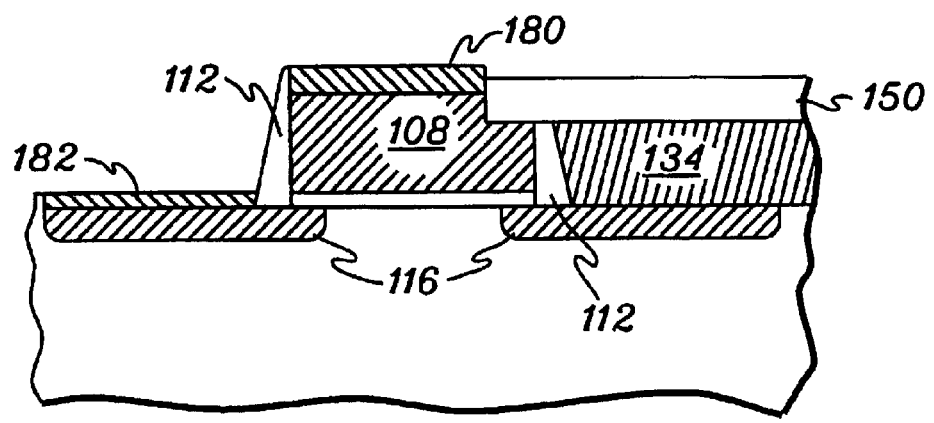
FIG. 11A is a cross-sectional elevational view of the structure of FIG. 9 after removal of the nitride and oxide layers and formation of node silicide and word-line silicide.
Figure 11B:
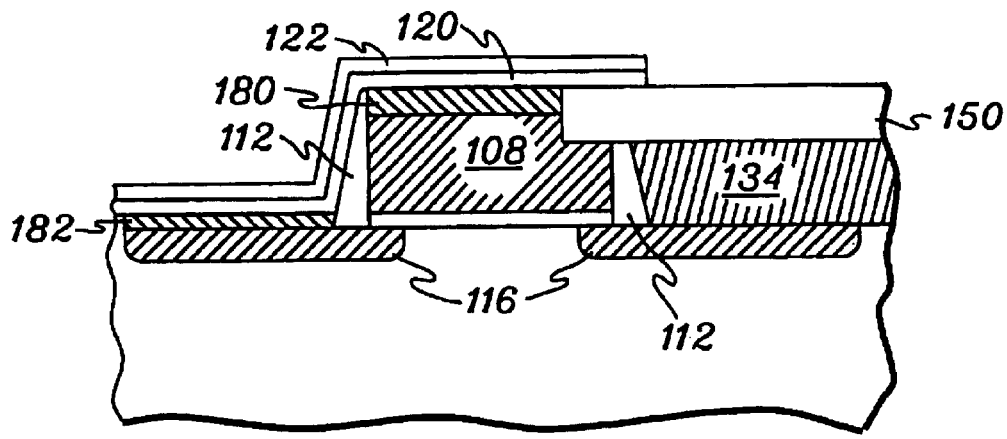
FIG. 11B is a cross-sectional elevational view of the structure of FIG. 11A after formation and patterning of an oxide and nitride layer to cover the gate structure.

FIG. 11B depicts the structure of FIG. 11A after conformal oxide layer 120 and nitride layer 122 have been redeposited and stripped employing a photo resist mask such as depicted in FIG. 5. Note that in FIG. 11B, the oxide/nitride overlay mask is shown to be misaligned over the bit-line contact 134. Alternatively, the wrapper 120/122 could misalign over the word-line contact 180, but the misalignment over the bit-line contact is worst case for interconnect bit-line wiring. This is contrasted with FIG. 10A, where the contact is shown in its worst case for shorting.

Figure 11C:
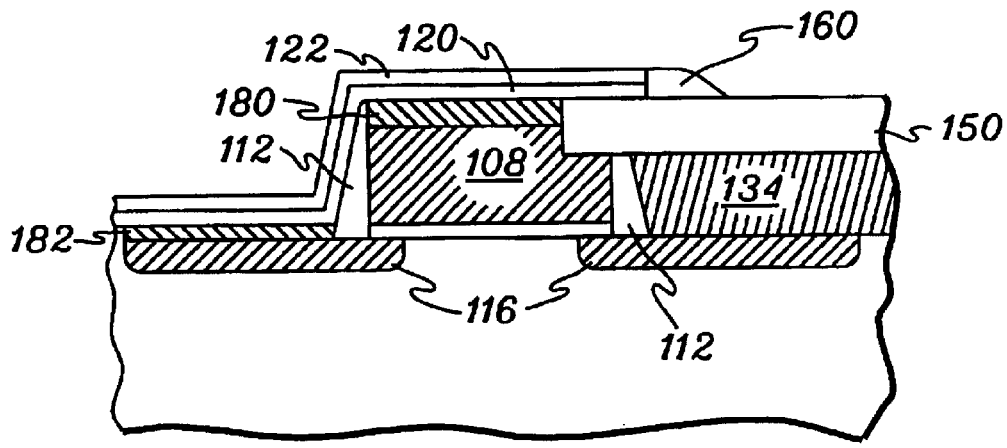
Figure 11D:
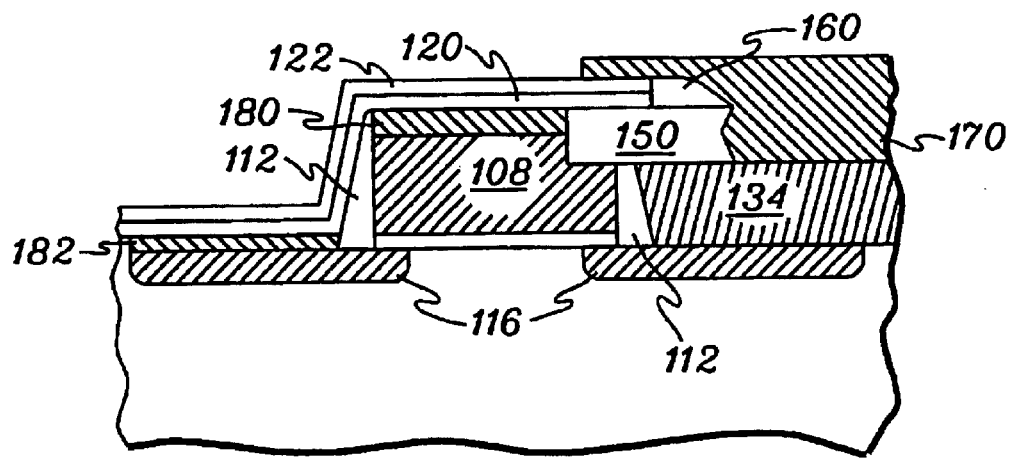
FIG. 11D is a cross-sectional elevational view of the structure of 11C after exposure of the bit-line polysilicon contact and formation of a final bit-line contact thereto, wherein the side wall spacer disposed above the bit-line polysilicon ensures that the gate remains electrically isolated from the adjacent bit-line contact.

In FIG. 11C, a silicon nitride spacer 160 has again been formed to ensure protection of oxide 150 over gate 108, i.e., if needed.

Exposed oxide 150 is then etched to allow for deposition of the final bit-line contact 170 which electrically contacts stud 134 and is isolated from gate 108 notwithstanding that the contact extends over the gate stack. Thus, the result of the present invention is a borderless bit-line contact relative to the gate, without restricting whether the final bit-line extends over the gate, and without employing a capped gate structure such as conventionally used.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A semiconductor processing method comprising:

providing a first conductive material above a substrate, with a first contact hole being disposed adjacent to the first conductive material, wherein a horizontal surface of the first conductive material is adjacent to the first contact hole;

providing a mask extending over a portion of the first conductive material, the mask having a second contact hole formed therein, the second contact hole extending over the first contact hole and exposing a portion of the horizontal surface of the first conductive material;

disposing a second conductive material in the first contact hole; and providing an electrically insulating spacer lining at least a portion of the second contact hole and extending to the second conductive material, wherein the insulating spacer has a dimension sufficient so that first conductive material is unexposed, and wherein the second conductive material is recessed below the horizontal surface.

2. The method of claim 1, further comprising providing a spacer along a sidewall of the first contact hole to isolate the second conductive material from the first conductive material along the sidewall, wherein the second conductive material is borderless to the first conductive material.

3. The method of claim 1, wherein the first conductive material comprises a cap-free gate conductor of a field effect transistor.

4. The method of claim 1, further comprising providing a bit-line contact disposed so that it is partially in the second contact hole, and electrically connecting to the second conductive material in the first contact hole, and extending at least partially above the first conductive material.

5. The method of claim 4, wherein the first conductive material comprises a cap-free 2 gate of the field effect transistor.

6. The method of claim 5, wherein the cap-free gate comprises a memory word-line, and is borderless to the conductor and the bit-line contact.

7. The method of claim 1, wherein the providing of the electrically insulating spacer includes creating an insulating layer aligned to the second contact hole and extending into the first conductive material and the second conductive material.

* * * * *